(12) United States Patent
Ueda

(10) Patent No.: US 7,589,024 B2
(45) Date of Patent: Sep. 15, 2009

(54) PROCESS FOR PRODUCING SEMICONDUCTOR INTEGRATED CIRCUIT DEVICE

(75) Inventor: Yasuhiko Ueda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 147 days.

(21) Appl. No.: 11/594,746

(22) Filed: Nov. 9, 2006

(65) Prior Publication Data

US 2007/0111373 A1    May 17, 2007

(30) Foreign Application Priority Data

Nov. 11, 2005  (JP)  ............................. 2005-327523
Oct. 18, 2006  (JP)  ............................. 2006-283816

(51) Int. Cl.
   *H01L 21/311*  (2006.01)
(52) U.S. Cl. .................. 438/696; 438/639; 438/738
(58) Field of Classification Search ................ 438/694, 438/696, 736, 738, 639; 257/E29.162
See application file for complete search history.

(56) References Cited

U.S. PATENT DOCUMENTS 7,052,972 B2*   5/2006  Sandhu et al. .............. 438/445
2001/0018252 A1*  8/2001  Park et al. ................... 438/286
2008/0057724 A1*  3/2008  Kiehlbauch et al. ......... 438/706

FOREIGN PATENT DOCUMENTS

| JP | 8-83785 | 3/1996 |
|---|---|---|
| JP | 10-73927 | 3/1998 |
| JP | 2001-281886 | 10/2001 |
| JP | 2003-297813 | 10/2003 |
| JP | 2004-205699 | 7/2004 |
| JP | 2006-41486 | 2/2006 |
| WO | WO 2004/034445 | 4/2004 |

OTHER PUBLICATIONS

Japanese Office Action dated Oct. 8, 2008 with partial English translation.

* cited by examiner

*Primary Examiner*—David S Blum
(74) *Attorney, Agent, or Firm*—McGinn IP Law Group, PLLC

(57) ABSTRACT

Recently, with shortened wavelengths employed in aligners, it is now difficult to use a material containing a benzene ring as a photoresist material. Since resist has extremely low plasma resistance, formation of deep holes using a photoresist as a dry etching mask is difficult. Under such circumstances, in the present invention, amorphous carbon film 6 is formed on photoresist 4 in which first hole 5 is formed, and using amorphous carbon film 6 as a mask, deep second hole 7 is formed in a etch target material such as underlying $SiO_2$ film 2.

17 Claims, 6 Drawing Sheets

PROCESS FOR PRODUCING SEMICONDUCTOR INTEGRATED CIRCUIT DEVICE

BACKGROUND OF THE INVENTION

1. Field of the Invention

The present invention relates to a process for producing a semiconductor integrated circuit device, more specifically to a process for producing a semiconductor integrated circuit device in which a hole with a high aspect ratio is formed.

2. Related Art

With accelerating high integration and high speed of semiconductor devices, photolithographic technology, which is the key to attaining such high integration and high speed, has been actively developed. Such high integration and high speed of semiconductor devices require miniaturization of wiring patterns, and shortening of exposure wavelength has greatly contributed to the achievement of the miniaturization. In particular, shortening of wavelength from i-line (365 nm) to KrF (248 nm) has made a great change in the field. Also, for attaining high resolution and high sensitivity of resist materials, which is the core of the photolithographic technology, development of chemically amplified resist using acid as a catalyst has been very successful.

The growing trend of miniaturization requires further shortening of exposure wavelength, and aligners employing ArF (193 nm) or F2 (157 nm), which is shorter than KrF, is now being developed.

On the other hand, use of shorter wavelength in aligners limits which photoresist materials can be used. Conventionally, while materials containing a benzene ring have been used as photoresist materials to maintain dry etching resistance, in exposure using ArF laser, benzene rings show great absorption at 193 nm which is the wavelength of the ArF laser beam, and therefore the resist has low optical transparency and thus the beam hardly reaches the lower part of the resist, resulting in trailing or defect in development due to underexposure. For this reason, using a material containing a benzene ring as a photoresist material for ArF laser is difficult and this causes a problem that dry etching resistance of resist is reduced. Although various studies have been made in order to increase the etching resistance of resist for ArF, the increase cannot be easily achieved with other specific properties such as resolution.

As described above, although shortening of exposure wavelength requires a resist material adaptable to short wavelength, the problem is that no optimal material is readily available.

Under such circumstances, as a solution to the above problem, it is suggested to miniaturize resist patterns manufacturable at present in the step other than lithography so as to respond to the demand of miniaturization. For example, Japanese Patent Laid-Open Nos. 2001-281886, 2004-205699 and 10-73927 disclose a technique of miniaturization of resist patterns formed using KrF laser beams or ArF laser beams.

Japanese Patent Laid-Open No. 2001-281886 discloses a technique of reducing the size of a resist pattern previously formed, and Japanese Patent Laid-Open Nos. 2004-205699 and 10-73927 disclose a technique of making a previously formed resist larger and narrowing the space between the resist.

The techniques disclosed in the above conventional arts have an advantage that patterns can be formed using a conventional aligner and resist, but with smaller wiring rules, they have difficulty in maintaining dimensional accuracy when changing the predetermined dimension of patterns of a photoresist film.

On the other hand, when forming a hole with a high aspect ratio using a photoresist film having low etching resistance as a mask, the resist is deformed as etching proceeds, and thus pits are formed or the periphery of holes in the photoresist becomes rough, causing problems such as deformation of hole shapes (see FIG. 1). At present, when forming a hole by using a photoresist for ArF as a mask, the hole may be deformed if it is deeper than 700 nm. When applied to mass production, it is difficult to form holes deeper than 600 nm in a stable manner. Holes deeper than 700 nm are needed, for example, when forming a contact used for connecting wiring of an upper layer and wiring of a lower layer.

Also, the shorter the exposure wavelength, the lower the transmittance of resist, and so it is necessary to reduce the film thickness of the resist, which makes it even more difficult to form a hole with a high aspect ratio.

To prevent deformation or defective shaping of patterns formed on a resist, Japanese Patent Laid-Open No. 2003-297813 discloses a method comprising forming an antireflection layer made of an organic material on an etch target layer, forming a photoresist for ArF laser thereon and patterning the same, selectively etching the antireflection layer through the photoresist pattern as a mask with $O_2$ plasma, depositing a polymer produced in etching on the surface of the photoresist at the same time when the etch target layer is exposed, thereby forming a polymer layer, and selectively etching the etch target layer using the photoresist pattern on which the polymer layer is formed as a mask. The polymer layer prevents deformation of the photoresist during etching as it serves as a protective film for the photoresist when the etch target layer is selectively etched. However, since the polymer layer is formed from the antireflection layer as the raw material in the method, the photoresist may not be fully protected due to the lack of the raw material when forming holes with a small hole area such as contact holes, although holes can be formed without any problem when the hole area is certainly large. Also, since the film thickness of the polymer layer tends to be uneven in the periphery of holes in the photoresist and regions distant from the periphery, the photoresist is deformed in regions distant from holes when forming deep holes, making it impossible to fully suppress the impact on the underlying layer.

In addition, for forming a hole deeper than 600 nm in an underlying insulating film, performing dry etching is known using a hard mask composed of a material having high etching selectivity relative to the underlying insulating film.

An insulating film having a low relative dielectric constant (Low-k material), such as a silicon oxide film or a plasma CVD-SiOC film is used as the underlying insulating film. A material with high etching selectivity relative to such an insulating film must be selected as a film for hard mask. For example, while a silicon nitride film or a silicon oxynitride film is used as a material of hard mask used for a silicon oxide film, such a material for hard mask often has a higher relative dielectric constant than an underlying insulating film.

When the material of hard mask has a higher relative dielectric constant than the underlying insulating film, there may be a problem that inter-wiring capacitance increases and properties of semiconductor integrated circuit devices are deteriorated.

Japanese Patent Laid-Open No. 2006-41486 discloses a method using a non-crystalline carbon film (amorphous carbon film) as a sacrificial hard mask layer. The publication describes that the noncrystalline carbon film is capable of offering high etching selectivity relative to the underlying insulating film to be etched.

SUMMARY OF THE INVENTION

An object of the present invention is to provide a process for producing a semiconductor device capable of forming a hole with a high aspect ratio without deteriorating dimensional accuracy even though a resist pattern formed from a photoresist material having low etching resistance is used.

In the present invention, low etching resistance of a photoresist material is offset at initial stages of etching or throughout the etching steps by depositing an amorphous carbon film on the photoresist material having low etching resistance. In particular, what makes the present invention unique is the finding that amorphous carbon is deposited on a photoresist made of an organic material with high probability even though an amorphous carbon film is deposited on the photoresist after forming a hole. Although formation of an amorphous carbon film under a photoresist is known as described in Japanese Patent Laid-Open No. 2006-41486, it is totally unexpectable that when an amorphous carbon film is formed on a photoresist film in which holes are formed, the amorphous carbon film is primarily deposited on the top face of the photoresist film made of an organic material or the side of the holes, and the amount to be deposited on an etch target material exposed at the holes is small, enabling etching of an underlying etch target material through the deposited amorphous carbon film as an etching mask.

Accordingly, the present invention provides a process for producing a semiconductor integrated circuit device comprising the steps of:

forming a photoresist film on an etch target material, forming a first hole by patterning the photoresist film so as to expose the surface of the etch target material, depositing an amorphous carbon film on the photoresist film and the side wall of the first hole at a film thickness such that the first hole is not filled with the amorphous carbon film, and forming a second hole in the etch target material through the amorphous carbon film, or the amorphous carbon film and the photoresist film as a mask.

Preferably, the amorphous carbon film is formed by a plasma CVD method.

Preferably, an antireflection film is formed between the etch target material and the photoresist film. When such an antireflection film is formed, a predetermined hole is formed in the photoresist film and then the antireflection film exposed at the bottom of the predetermined hole is removed to form the first hole, and then an amorphous carbon film is deposited.

Also, for forming the amorphous carbon film using as a mask to etch the etch target material, the first hole has an aspect ratio of preferably 1.8 or more.

Preferably, the etch target material is an insulating film formed on a substrate. Preferably, the insulating film is a silicon dioxide film, a silicon nitride film, a silicon oxynitride film, a methylsiloxane insulating film or an insulating film composed of porous SiOC or porous SiOCH.

Further, to form an even deeper hole, preferably the etch target material is an insulating film formed on a substrate and a sacrificial hard mask layer formed on the insulating film, and the second hole is formed in the sacrificial hard mask layer through the amorphous carbon film, or the amorphous carbon film and the photoresist film as a mask, a third hole is formed in the insulating film through the second hole, the third hole thus formed is filled with a resist and the layer remaining on the insulating film is removed.

The present invention makes it possible to form a hole with a high aspect ratio using a photoresist having low etching resistance without deteriorating dimensional accuracy by forming a film of amorphous carbon on the surface of the photoresist.

Forming an amorphous carbon film on the photoresist surface improves the etching resistance of the photoresist and also has an advantage that the size of the hole becomes small (shrink).

DETAILED DESCRIPTION OF THE PREFERRED EMBODIMENTS

Embodiments of the present invention are described with reference to the drawings.

FIGS. 2A to 2D are schematic cross-sectional views of steps describing a production process which is a first embodiment of the present invention. In this embodiment, an insulating film formed on a substrate in a semiconductor device or the like, in particular, a silicon dioxide film formed on a silicon substrate is described as an etch target material.

Figure 1:
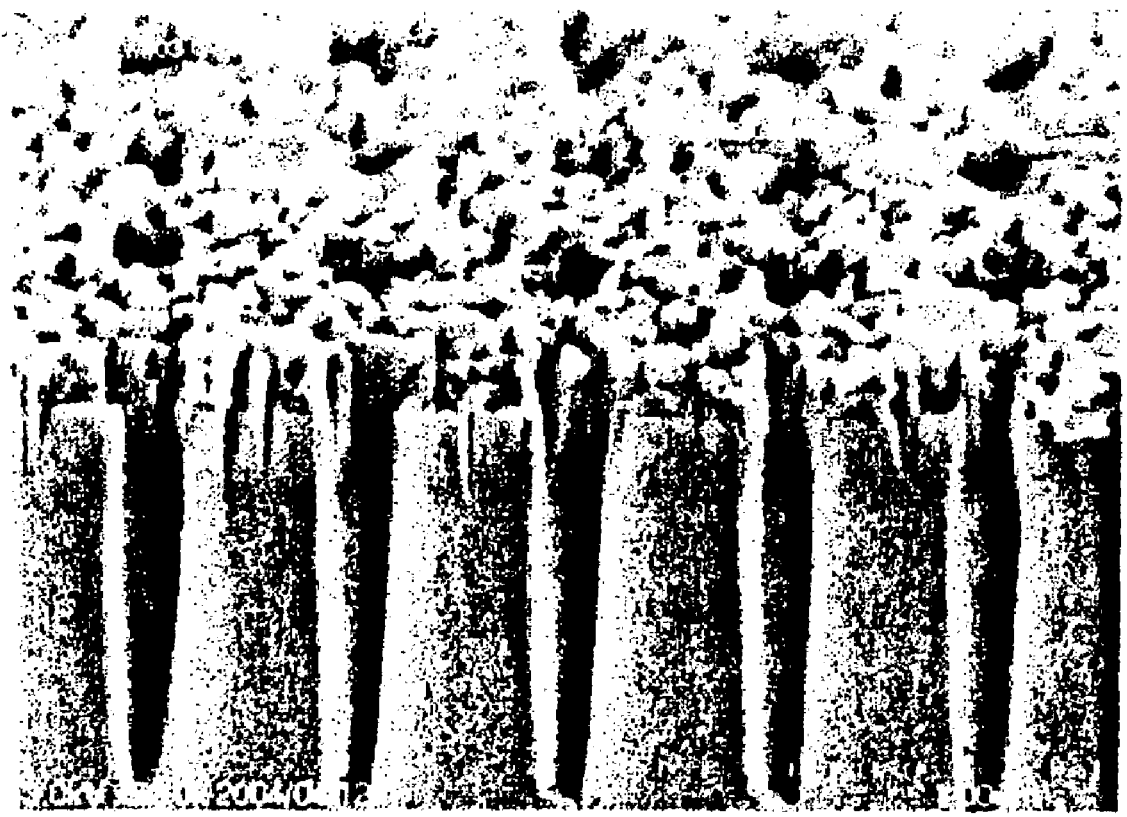
FIG. 1 is a SEM image showing a problem of conventional arts.
Figure 2A:
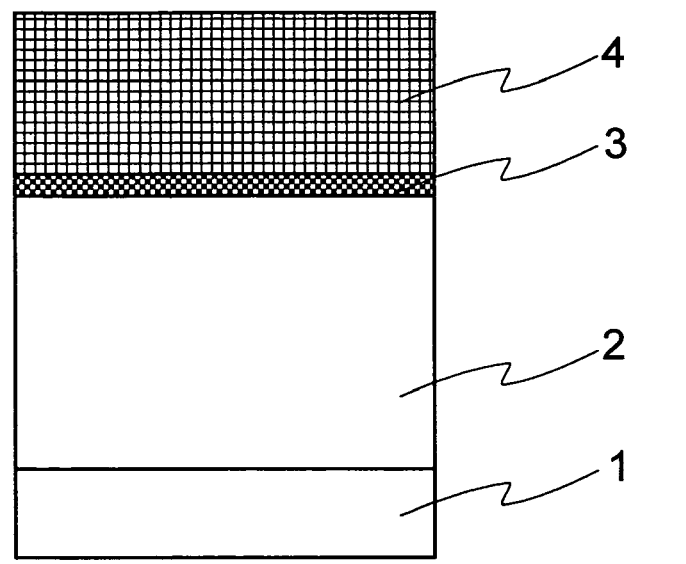
FIGS. 2A to 2D are schematic cross-sectional views of steps for describing a first embodiment of the present invention.
Figure 2B:
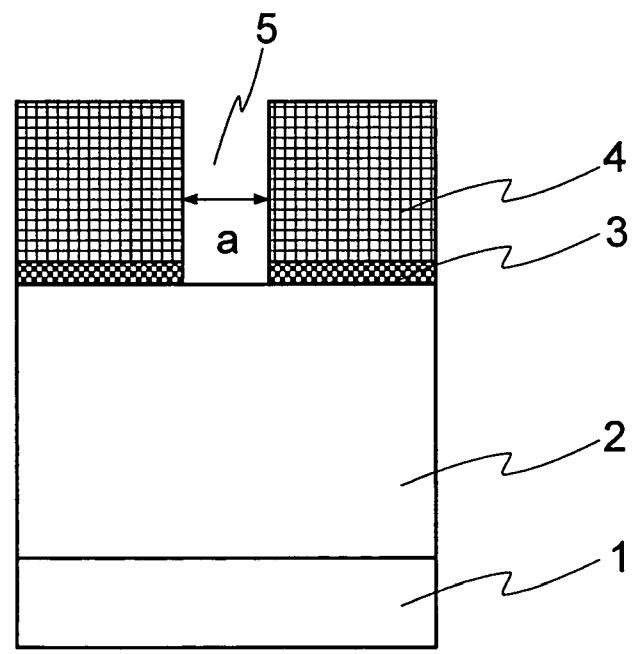

Silicon dioxide film 2 is formed on silicon substrate 1, and antireflection film BARC (Bottom Anti-Reflective Coating) 3 and photoresist 4 are formed on silicon dioxide film 2 (FIG. 2A). Subsequently, a pattern of a desired hole diameter is formed on photoresist film 4 by a conventional photolithography step, and BARC 3 is removed by using the pattern as a mask so that the surface of underlying silicon dioxide film 2 is exposed. With this procedure, the first hole 5 with a hole diameter of a is formed in photoresist 4 and BARC 3 (FIG. 2B). BARC 3 is removed before forming amorphous carbon film 6 by using photoresist film 4 as a mask so that the surface of the underlying silicon dioxide film 2 is exposed. BARC 3 can be removed, for example, by anisotropic dry etching using a mixed gas of fluorocarbon gas such as $CF_4$ and oxygen. Then, amorphous carbon film 6 is formed on photoresist film 4 in which the first hole 5 is formed by a known method such as a CVD method. Preferably, amorphous carbon film 6 is formed by a CVD method, in particular, a plasma CVD method.

Figure 2C:
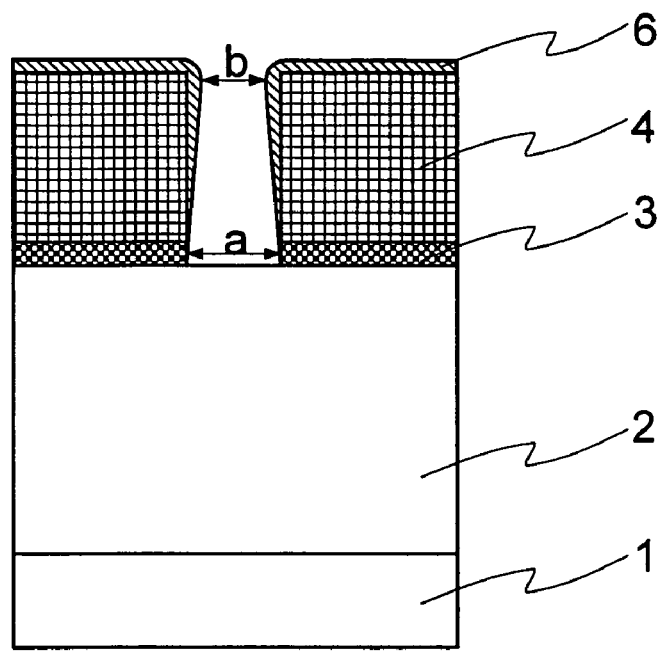

Since amorphous carbon film 6 is primarily deposited on photoresist film 4 and the side wall of the first hole 5 formed in photoresist film 4 and BARC 3, the hole diameter (b) is narrower than the hole diameter (a) of the first hole 5 (FIG. 2C).

Figure 2D:
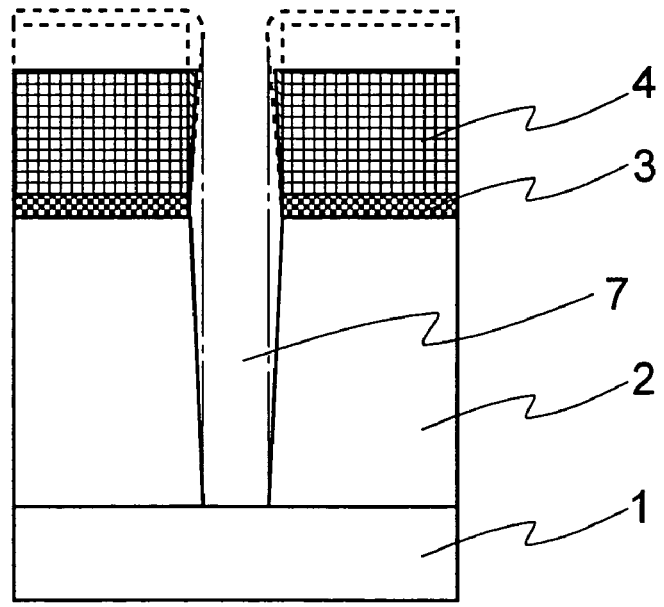
Figure 3:
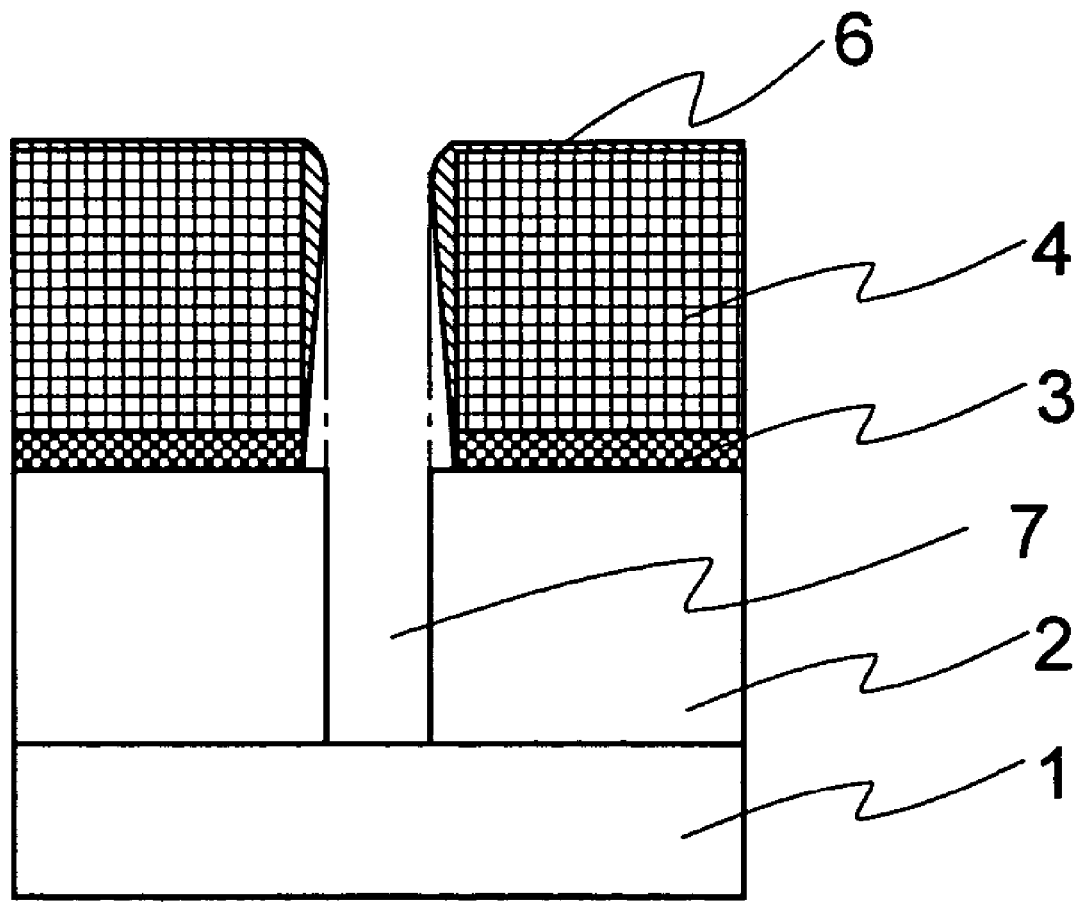
FIG. 3 is a schematic cross-sectional view for describing a modified example of the first embodiment of the present invention.

Lastly, as shown in FIG. 2D, usual anisotropic dry etching is performed by using amorphous carbon film 6 as a mask so that the underlying silicon dioxide film 2 is etched, thereby forming second hole 7 extending to silicon substrate 1. FIG. 2D shows that amorphous carbon film 6 is gradually etched as silicon dioxide film 2 is etched, where further etching is performed with photoresist film 4 being exposed. However, when silicon dioxide film 2 in which a hole is to be formed has a small film thickness or when the amorphous carbon film is formed at a sufficient film thickness, amorphous carbon film 6 may remain on photoresist film 4 even after the completion of etching as shown in FIG. 3. In that case, amorphous carbon film 6 alone serves as a mask, and the second hole formed in silicon dioxide film 2 has a rectangular cross section with a hole diameter (b) due to amorphous carbon film 6, not a tapered cross section as shown in FIG. 2D.

Any method may be used for anisotropic dry etching of silicon dioxide film 2 as long as it is performed under conditions providing sufficient etching selectivity relative to amorphous carbon film 6. For example, a method using a usual plasma etching device with a $C_4F_6/Ar/O_2$ gas may be used. Also, when holes are formed so that they reach silicon substrate 1 as in this embodiment, etching is preferably performed under an over-etching condition of about 20 to 30%.

When forming an amorphous carbon film on a photoresist film by a CVD method, burning of photoresist film may occur depending on conditions. Occurrence of such burning sometimes makes it difficult to remove the photoresist film remaining after etching. In the present invention, an amorphous carbon film is preferably uniformly formed on a photoresist film under conditions where burning of photoresist film does not occur. The conditions are not limited thereto when a sacrificial hard mask layer is formed on an insulating film which is the final etching target as in the second embodiment described later; however, it is preferred that an amorphous carbon film is formed under conditions where burning of photoresist film does not occur as well in order to prevent deformation of the shape of the hole due to burning.

Hydrocarbon compounds such as $C_2H_2$ (acetylene), $C_3H_6$ (propene), $C_4H_8$ (butene), $CH_4$ (methane), $C_2H_6$ (ethane), $C_3H_8$ (propane) and $C_4H_{10}$ (butane), which are in the form of gas at room temperature (about 25° C.), are used as a raw material gas in the CVD method.

The higher the ratio of carbon atoms, the higher the film forming efficiency, and therefore $C_2H_2$ (acetylene), $C_3H_6$ (propene), $C_4H_8$ (butene) or the like is preferred.

It is known that for amorphous carbon, a raw material gas such as $C_2H_2$ (acetylene), $C_3H_6$ (propene), $C_4H_8$ (butene), $CH_4$ (methane), $C_2H_6$ (ethane), $C_3H_8$ (propane) or $C_4H_{10}$ (butane) is used after diluting with inert gas such as helium or argon. However, when an amorphous carbon film is formed on a photoresist film as in the present invention, the photoresist film is damaged during formation of the amorphous carbon film if the raw material gas is diluted with a gas having a high atomic weight such as argon, and the photoresist film may be burned onto the substrate. For this reason, preferably the raw material gas is diluted with a gas having a low atomic weight such as helium.

At this stage, the film thickness of the amorphous carbon film to be deposited must be less than ½ of the hole diameter (a) of the first hole 5 so that the first hole 5 is not filled with the deposited amorphous carbon film 6. The film thickness of the amorphous carbon film is preferably ⅓ or less, more preferably ¼ or less of the hole diameter (a). On the other hand, to form a uniform amorphous carbon film on the photoresist film, the film thickness of the amorphous carbon film is preferably 1 nm or more, more preferably 5 nm or more. In practice, preferably the optimal film thickness is accordingly selected based on the etching selectivity of the etch target material and the amorphous carbon film in order to form a hole with a desired depth in the etch target material using the amorphous carbon film and the photoresist as a mask.

Although the amorphous carbon film is primarily deposited on the photoresist and the side wall of the first hole, a small amount of the amorphous carbon film is also deposited on the surface of the etch target material exposed at the bottom of the first hole. When the amount of the amorphous carbon film deposited on the surface of the etch target material exposed at the bottom of the first hole is sufficiently smaller than the amount of the amorphous carbon film formed on the photoresist film, the amorphous carbon film deposited on the surface of the etch target material is removed by etching as the etching proceeds, and therefore etching of the etch target material is possible. However, in some cases, a hole with a desired depth cannot be formed in the etch target material. This is more likely when the first hole has a larger hole diameter, and the amount of the amorphous carbon film deposited on the surface of the etch target material is also larger when the first hole is shallow. Such a problem can be eliminated by increasing the ratio of the diameter to the depth of the first hole, i.e., the aspect ratio of the first hole. In the present invention, when the first hole has an aspect ratio of 1.8 or more, substantially no amorphous carbon film is deposited on the surface of the etch target material.

The photoresist material used in the present invention is not particularly limited, but for forming a smaller hole, materials having photosensitivity to actinic rays of 300 nm or less (e.g., KrF excimer laser beams), in particular actinic rays of 200 nm or less (e.g., ArF excimer laser beams and F2 laser beams) are preferred. Also, since an amorphous carbon film is formed on a photoresist film on which a pattern is formed, it is preferred that the photoresist material has sufficient heat resistance such that the pattern is not deformed under conditions of forming the amorphous carbon film. Generally the photoresist material has heat resistance of 150° C. or higher, preferably 160° C. or higher.

Recently, with miniaturization of wiring, deterioration of properties of semiconductor elements caused by inter-wiring capacitance has become a problem. To solve this problem, an insulating film called a Low-k film having a low dielectric constant has been developed as an alternative to silicon dioxide films, silicon nitride films or silicon oxynitride films which have been used as interlayer insulating films.

Examples of such Low-k films include organic silicon polymer materials such as BCB (divinyl-siloxane-bis-benzocyclobutene, $C_{24}H_{30}OSi_2$) and TMCTS (1,3,5,7-tertamethyl-cyclotetrasiloxane, $SiH(CH_3)O$). The materials, however, have low etching selectivity of 1.3 to 1.5 relative to an amorphous carbon film, and therefore it is difficult to form a hole in such materials using the amorphous carbon film as a mask. On the other hand, methylsiloxane insulating films such as methylsiloxane (available from Allied Signal, Inc., product name: Nanoglass) or methylsiloxane hydride (available from Honeywell, product name: HOSP) or insulating films such as porous SiOC or porous SiOCH have high etching selectivity of about 20 relative to an amorphous carbon film, and therefore they are preferred as the insulating film according to the present invention in which a hole is formed.

Low-k films other than insulating films such as methylsiloxane films, porous SiOC or porous SiOCH films may also be used without any problem as long as the material has sufficient etching selectivity relative to the amorphous carbon film.

Generally, if a hole with a depth of 1.0 to 1.5 μm can be formed in a material, the material can be applied to the semiconductor integrated circuit devices. Here, for example, in the case of an etch target material having etching selectivity of 20 relative to the amorphous carbon film, and when the amorphous carbon film has a film thickness of 30 nm, a hole with a depth of 600 nm can be formed in the etch target material only with the amorphous carbon film. Moreover, if the depth of a hole that can be formed only with a photoresist film without causing a problem is, for example, 600 nm, a hole with a total depth of 1.2 μm can be formed without deformation of the pattern. Since over-etching of 20 to 30% needs to be taken into account in practical cases, a hole with a depth of about 1 μm can be formed in the above example.

As described above, it is preferred that the insulating film material is selected so that a hole with a desired depth can be formed by using an amorphous carbon film and a photoresist film as a mask. The higher the etching selectivity relative to the amorphous carbon film the insulating film material has, the deeper the hole that can be formed in the insulating film only with the amorphous carbon film. In other words, when holes of the same depth are formed, photoresist materials can be selected from a broader range because the larger the contribution from the amorphous carbon film, the smaller the contribution from the photoresist film. Assuming that the contribution from the photoresist film is the same, a deeper hole can be formed with an amorphous carbon film having higher etching selectivity among amorphous carbon films of the same the film thickness.

In the following, the present invention is described with reference to Test Examples.

Test Example A

In Test Example A, growth conditions of forming amorphous carbon film on a photoresist film were studied.

Study of Growth Conditions of Amorphous Carbon Film

Although amorphous carbon film can be formed by a CVD method or a sputtering method, formation by the CVD method is preferred because amorphous carbon film is used as a mask in etching.

Japanese Patent Laid-Open No. 7-221302 discloses formation of an amorphous carbon film by introducing 300 SCCM of acetylene-helium ($C_2H_2$—He) and 30 SCCM of Ar as reactant gases under conditions of a pressure in a chamber of 133 Pa (1 Torr), a substrate temperature of 200° C., an RF frequency of 200 KHz and an RF power of 30 W. However, when amorphous carbon film is formed on an ArF photoresist film in the above conditions, the ArF photoresist film is burned onto the substrate. Thus, the film forming conditions of amorphous carbon film were studied.

The ArF photoresist material used herein has a limit of heat resistance of 160° C. in a catalog.

For the film forming conditions, raw material gas: propene-helium ($C_3H_6$—He): 1200 sccm
pressure: 400 Pa (3 Torr) and
RF frequency: 13.56 MHz were fixed, and the substrate temperature and the RF power conditions were changed, and an amorphous carbon film having a film thickness of 30 nm was formed.

The amorphous carbon film having a film thickness of 30 nm was formed on a substrate on which a photoresist film having a film thickness of 300 nm was formed using the aforementioned ArF photoresist material.

The conditions of the tests and the evaluation results are shown in Table 1.

For the evaluation criteria,

Evaluation 1: cases where burning did not occur and the photoresist film could be easily removed after formation of the amorphous carbon film were rated as "A", cases where burning of the photoresist film occurred and the photoresist film could be removed in twice the time it took for removing the photoresist film without burning were rated as "B", and cases where the photoresist film could not be removed were rated as "C", and Evaluation 2: the film thickness of amorphous carbon was measured at the center and four peripheral positions in the substrate of φ20 cm, and cases where the variation in the film thickness in the substrate was 5% or less were rated as "A", cases where the variation was 10% or less were rated as "B", and cases where the variation was more than 10% were rated as "C".

TABLE 1

| Test No. | Substrate Temp. (° C.) | RF power | Substrate temp. (° C.) after film forming | Increase in substrate temp. (° C.) | Evaluation 1 (burning) | Evaluation 2 (variation in film thickness) |
|---|---|---|---|---|---|---|
| 1 | 80 | 200 | 100 | 20 | A | C |
| 2 |  | 400 | 100 | 20 | A | C |
| 3 |  | 600 | 95 | 15 | A | C |
| 4 |  | 800 | 95 | 15 | A | C |
| 5 | 85 | 200 | 105 | 20 | A | C |
| 6 |  | 400 | 105 | 20 | A | C |
| 7 |  | 600 | 100 | 15 | A | C |
| 8 |  | 800 | 100 | 15 | A | C |
| 9 | 90 | 200 | 110 | 20 | A | C |
| 10 |  | 400 | 110 | 20 | A | B |
| 11 |  | 600 | 105 | 15 | A | B |
| 12 |  | 800 | 105 | 15 | A | B |
| 13 | 95 | 200 | 115 | 20 | A | C |
| 14 |  | 400 | 115 | 20 | A | A |
| 15 |  | 600 | 110 | 15 | A | A |
| 16 |  | 800 | 110 | 15 | A | A |
| 17 | 100 | 200 | 120 | 20 | A | C |
| 18 |  | 400 | 120 | 20 | A | A |
| 19 |  | 600 | 115 | 15 | A | A |
| 20 |  | 800 | 115 | 15 | A | A |
| 21 | 105 | 200 | 125 | 20 | B | C |
| 22 |  | 400 | 125 | 20 | B | A |
| 23 |  | 600 | 120 | 15 | A | A |
| 24 |  | 800 | 120 | 15 | A | A |
| 25 | 110 | 200 | 130 | 20 | C | C |
| 26 |  | 400 | 130 | 20 | C | A |
| 27 |  | 600 | 125 | 15 | B | A |
| 28 |  | 800 | 125 | 15 | B | A |

In Test Nos. 1 to 8 in which the substrate temperature is 80° C. or 85° C., the variation in the film thickness is more than 10%. Also, when the RF power is 200 W, the variation in the film thickness is always more than 10%. In Test Nos. 10 to 12 in which the substrate temperature is 90° C., the variation in the film thickness is 10% or less, which is sufficient for practical use. In Test Nos. 14 to 16, 18 to 20, 22 to 24 and 26 to 28, the substrate temperature is adjusted to 95° C. or higher, and thus the variation can be kept at 5% or less.

In the photoresist material and the film forming apparatus used herein, it has been found that the lower limit of the substrate temperature is preferably 90° C., more preferably 95° C. in consideration of the variation in the film thickness of the amorphous carbon film on the substrate.

On the other hand, burning of photoresist occurred at a substrate temperature of 105° C. or higher. In particular, burning was found when the substrate temperature after film forming was higher than 125° C. rather than at the substrate temperature at the start of film forming. When the substrate temperature was 130° C. or higher, removal of photoresist was difficult.

Burning starts when the temperature of the substrate after film forming exceeds 120° C. and reaches about 125° C., and removal of photoresist becomes difficult. When the temperature reaches 130° C., the photoresist is burned and adhered to the substrate and removal becomes even more difficult. This shows that the substrate temperature after film forming is preferably 125° C. or lower, more preferably 120° C. or lower.

The result shows that the higher the RF power, the lower the substrate temperature at the completion of film forming should be. This may be because when the RF power is too low, not only a large self bias (force to attract ions) is applied but also the film forming time is prolonged.

When the RF frequency is low, increase in the substrate temperature is great, and therefore a higher RF frequency can prevent such increase in the substrate temperature. Preferably, the RF frequency is as high as 13.56 MHz.

The reason why burning starts at a substrate temperature of about 125° C. even though the limit of the heat resistance of the photoresist material used is 160° C. seems to be because the temperature increase in the photoresist is not directly reflected in the increase in the substrate temperature although the temperature increases as the photoresist surface on the substrate surface is exposed to plasma. Despite the fact, evaluation is performed with the substrate temperature as the standard because the temperature on the substrate surface cannot be monitored with the configuration of the apparatus and it is difficult to control the temperature on the substrate surface so as to be kept to the limit of the heat resistance of the photoresist material with monitoring the substrate surface during production and to control the film thickness and variation in the film thickness on the substrate.

From the above results of Test Example A, studies were made in the following tests under the condition of Test No. 18 which produced the most preferred results.

Test Example B

Study of Conditions of Forming Hole in Photoresist Mask and Forming Amorphous Carbon Film Since amorphous carbon film is formed after forming a resist pattern (first hole) in the present invention, if amorphous carbon film is formed on the underlayer which is the etch target material exposed at the first hole formed in the photoresist film, the underlayer cannot be etched. Accordingly, conditions of forming holes in the photoresist mask and forming amorphous carbon film were studied.

In this study, after a silicon dioxide film was formed on a silicon substrate 1 in a film thickness of 1000 nm, BARC was formed in a film thickness of 60 nm and then ArF photoresist film was formed. Subsequently, the photoresist film was subjected to exposure and development using a photomask to form a hole, and then the BRAC was removed by etching using the photoresist film in which the hole was formed as a mask to form the first hole. Next, an amorphous carbon film was formed in a film thickness of 20 nm using a CVD method in the following film forming condition.

Film forming condition of amorphous carbon:
raw material gas: propene-helium ($C_3H_6$—He): 1200 sccm
pressure: 400 Pa (3 Torr)
RF frequency: 13.56 MHz
RF output: 400 W
substrate temperature: 100° C.

For the evaluation, after dry etching of the silicon dioxide film was performed for 15 seconds, the photoresist film and the BRAC were removed to form the second hole in the silicon dioxide film, and the surface of the bottom of the second hole was observed with a SEM:

Evaluation 1: for the evaluation of amorphous carbon formed at the bottom of the first hole, when the second hole of a desired depth was formed and the surface at the bottom of the second hole was smooth, it was determined that amorphous carbon was not formed at the bottom of the first hole, which cases were rated as "A", and cases other than those were rated as "C"; and Evaluation 2: for the evaluation of the variation in the hole diameter (b) caused by the amorphous carbon film, cases where the second hole of a desired depth was formed at the center and four peripheral positions in the substrate of φ20 cm and the variation in the hole diameter was 5% or less were rated as "A", and cases where the variation was 10% or less were rated as "B". For Test Examples rated as "C" in evaluation 1, evaluation 2 was not performed.

In the tests, the film thickness of the photoresist film (abbreviated as PR film thickness) and the hole diameter were changed. The details of the tests and the evaluation results are shown.

TABLE 2

| Test No | PR film thickness (nm) | Hole diameter (nm) | Aspect ratio | Evaluation 1 | Evaluation 2 |
|---|---|---|---|---|---|
| 29 | 350 | 65 | 6.31 | A | B |
| 30 | 300 | 65 | 5.54 | A | B |
| 31 | 250 | 65 | 4.77 | A | B |
| 32 | 200 | 65 | 4.00 | A | B |
| 33 | 350 | 100 | 4.10 | A | A |
| 34 | 300 | 100 | 3.60 | A | A |
| 35 | 250 | 100 | 3.10 | A | A |
| 36 | 200 | 100 | 2.60 | A | A |
| 37 | 350 | 150 | 2.73 | A | A |
| 38 | 300 | 150 | 2.40 | A | A |
| 39 | 250 | 150 | 2.07 | A | A |
| 40 | 200 | 150 | 1.73 | C | — |
| 41 | 350 | 200 | 2.05 | A | A |
| 42 | 300 | 200 | 1.80 | A | A |
| 43 | 250 | 200 | 1.55 | C | — |
| 44 | 200 | 200 | 1.30 | C | — |

The results of evaluation 1 in Table 2 show that amorphous carbon was deposited at the bottom of the hole in Tests Nos. 40, 43 and 44 in which the aspect ratio was 1.73 or less. On the other hand, in the rest of the tests in which the aspect ratio was 1.8 or more, the result was that no amorphous carbon was deposited at the bottom of the hole. The aspect ratio in Table 2 is a value obtained by dividing the total of the PR film thickness and the BARC film thickness (60 nm) (depth of the first hole) by the hole diameter.

On the other hand, in Test Nos. 29 to 32 in which the hole diameter was 65 nm, the second hole was formed because the aspect ratio was 1.8 or more, but variation was found in the hole diameter of the second holes because the film thickness of the amorphous carbon film was 20 nm.

Since the variation in the hole diameter was found even though the aspect ratio was 1.8 or more, tests were performed while changing the film thickness of amorphous carbon to 5 to 25 nm with Test No. 30 as the standard.

The conditions of Test Examples and the evaluation results are shown in Table 3.

After dry etching of the silicon dioxide film was performed for 15 seconds, the photoresist film was removed to form a hole in the silicon dioxide film, and the bottom surface of the hole was observed with a SEM. Cases where a hole of a desired depth was formed at the center and four peripheral positions in the substrate of φ20 cm and the variation in the diameter of the second holes was 5% or less were rated as A, cases where the variation was 10% or less were rated as B, and cases where the variation was more than 10% were rated as C.

TABLE 3

| Test No. | Hole diameter (nm) | Ffilm thickness (nm) of a-C | Film thickness of a-C/hole diameter | Hole diameter (nm) of a-C | Evaluation |
|---|---|---|---|---|---|
| 45 | 65 | 5 | 0.08 | 63 | A |
| 46 | 65 | 10 | 0.15 | 60 | A |
| 47 | 65 | 15 | 0.23 | 56 | A |
| 30 | 65 | 20 | 0.31 | 40 | B |
| 48 | 65 | 25 | 0.38 | <35 | C |

Table 3 shows that the film thickness of the amorphous carbon film is preferably ⅓ or less of the hole diameter (a), and a film thickness of ¼ or less gave a good result that the variation in the diameter of the second holes formed by etching was 5% or less.

Test Example C

While examples of forming a hole in an insulating film of 1 μm were shown in the above Test Example B, the present invention makes it possible to form an even deeper hole. In this Test Example, after forming silicon dioxide film 2 on silicon substrate 1, BARC 3 was formed on silicon dioxide film 2 in a film thickness of 60 nm and photoresist film 4 for ArF was formed thereon in a film thickness of 320 nm, and then first hole 5 with a hole diameter of 120 nm was formed in photoresist film 4 and BARC 3. Amorphous carbon film 6 was formed on photoresist film 4, and silicon dioxide film 2 was etched by anisotropic dry etching with the amorphous carbon film as a mask to form a second hole.

For the conditions of forming the amorphous carbon film,
raw material gas: propene-helium ($C_3H_6$—He): 1200 sccm
pressure: 400 Pa (3 Torr)
RF frequency: 13.56 MHz
substrate temperature: 100° C., and
RF power: 600 W
were employed.

In the anisotropic etching, when the etching rate of the amorphous carbon film was α and the etching rate of the oxide film was β, an etching condition in which the etching selectivity (α/β) was 30 was employed.

TABLE 4

| Test No. | Film thickness of a-C (AC)(nm) | Depth of hole (μm) that can be formed only with a-C film (AC × selectivity) | Depth of hole (μm) that can be formed with PR film | Depth of hole (μm) that can be formed with a-C film and PR film |
|---|---|---|---|---|
| 49 | 20 | 0.6 | 0.6 | 1.2 |
| 50 | 25 | 0.8 | 0.6 | 1.4 |
| 51 | 30 | 0.9 | 0.6 | 1.5 |
| 52 | 35 | 1.1 | 0.6 | 1.7 |
| 53 | 40 | 1.2 | 0.6 | 1.8 |

While a stable hole having a depth of 0.6 μm can be formed in the ArF photoresist film used in the present invention at a film thickness of 320 nm, an even deeper hole can be formed by forming an amorphous carbon film on the photoresist film. Control of the film thickness of the amorphous carbon film makes it possible to adjust the depth of holes. Since over-etching of 20 to 30% is performed in practical cases when forming a hole extending through an insulating film, the film thickness may be selected in consideration of such over-etching.

Second Embodiment

The present invention provides a technique of forming an amorphous carbon film only on the upper part of a photoresist film and the wall of holes utilizing the high adsorption probability of carbon particles and the aspect ratio of the resist mask. Use of the technique enables $SiO_2$ contact processing at a high aspect ratio with a depth of 1 to 2 μm even in the case of using an ArF photoresist having low etching resistance.

However, since the technique has the limitation that an amorphous carbon film is formed on a photoresist after exposure and development, the film density and the film thickness of the amorphous carbon film are limited. Therefore, it seems extremely difficult to achieve the formation of $SiO_2$ contact holes having a depth of 2 μm or more with this technique.

Accordingly, to achieve the formation of a contact hole having a depth of 2 μm or more, a mask having high etching resistance is to be provided under the photoresist mask. Specifically, the second embodiment of the present invention provides a process for producing a semiconductor integrated circuit device, which comprises the steps of forming a sacrificial hard mask layer with high etching selectivity relative to the insulating film between the insulating film and the photoresist film, forming an amorphous carbon film on the photoresist film after forming a hole in the photoresist film, etching the sacrificial hard mask layer by using the amorphous carbon film as a mask to form a hole, etching the insulating film by using the amorphous carbon film, the photoresist film and the sacrificial hard mask layer as a mask to form a hole in the insulating film, filling the hole thus formed with a resist and then removing the layers remaining after forming the hole in the insulating film by plasma etching.

A material with not only sufficient etching selectivity relative to the underlying insulating film but also a certain etching selectivity relative to the amorphous carbon film is preferred as the sacrificial hard mask layer, because the hole is formed using the amorphous carbon film at the upper layer as a mask. For example, to form a $SiO_2$ contact hole, a silicon nitride film ($Si_3N_4$) or a polysilicon (Poly-Si) film may be used.

In the following, the second embodiment for forming a deep hole is described with reference to FIG. 4A to FIG. 4D. The same reference numerals are used for the same items as in the first embodiment, and description thereof is omitted.

In this embodiment, $SiO_2$ contact processing with a depth of 2.5 μm was performed using a polysilicon hard mask. In FIG. 4, reference numerals 1 to 6 denote the same things as in FIG. 2, reference numeral 8 denotes a polysilicon hard mask layer (hereinafter Poly-Si mask), reference numeral 9 denotes a contact hole and reference numeral 10 denotes a resist.

The film thickness of Poly-Si mask 8 is 400 nm, the film thickness of photoresist film 4 is 340 nm and the film thickness of BARC 3 is 65 nm. The $SiO_2$ layer 2 to be etched was formed by plasma CVD.

Figure 4A:
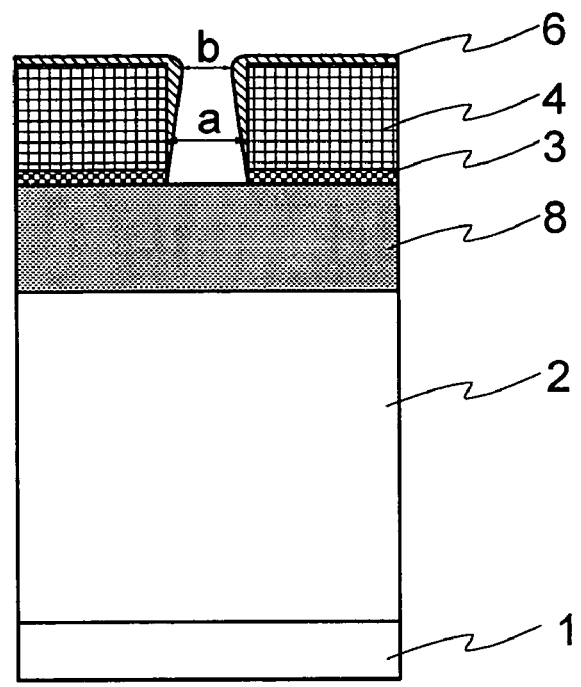
FIGS. 4A to 4D are schematic cross-sectional views of steps for describing a second embodiment of the present invention.
Figure 4B:
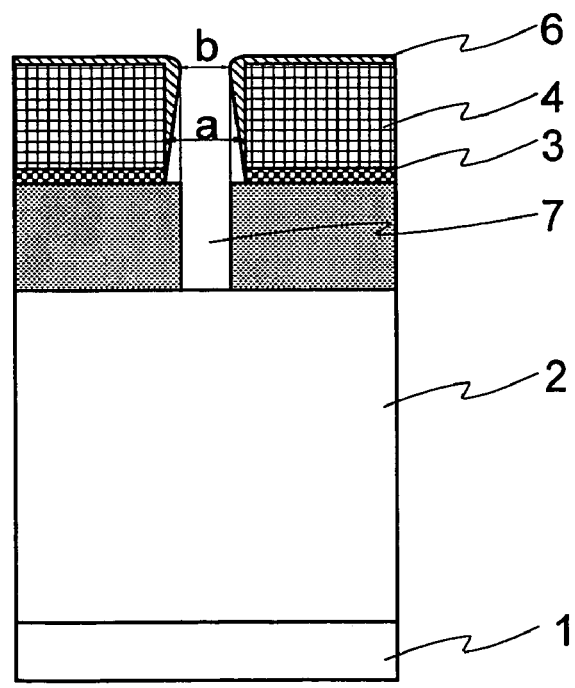

15 nm of amorphous carbon film 6 was deposited, on photoresist film 4 which has been patterned under the conditions shown in Test Example B, and the contact hole diameter (b) was adjusted to 100 nm (FIG. 4A). Poly-Si mask processing was first performed in that state (FIG. 4B). The etching conditions are as follows:

BARC etch: $Cl_2/O_2$=40/40 sccm, 2 Pa (15 mTorr), 30 sec
Poly-Si etch: $Cl_2/HBr/O_2$=100/300/4 sccm, 0.67 Pa (5 mTorr), 300 sec.

Figure 4C:
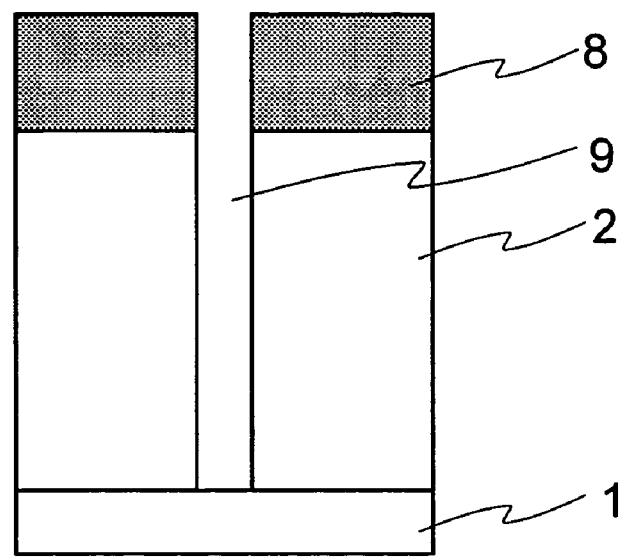

After forming the Poly-Si mask, $SiO_2$ contact hole etching was performed under the following conditions to form third hole 9 (FIG. 4C). BARC 3, photoresist film 4 and amorphous carbon film 6 on Poly-Si mask 8 are not shown for simplifying the description, but the presence of these films does not pose any problem.

SiO$_2$ etch: C$_4$F$_6$/Ar/O$_2$=40/700/45 sccm, 2.67 Pa (20 mTorr), 400 sec

Figure 4D:
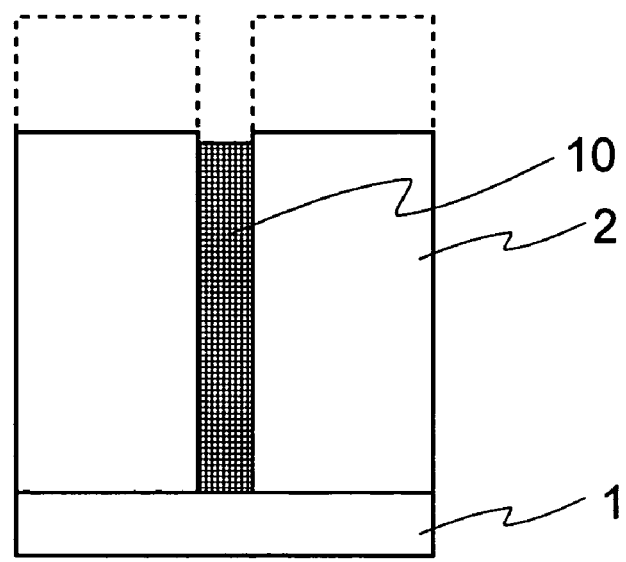

The Poly-Si mask can be finally removed by plasma etching after filling third hole 9 with resist 10 (FIG. 4D). Through the above procedures, a finely shaped contact hole With a depth of 2.5 μm (aspect ratio: 25) could be formed.

What is claimed is:

1. A process for producing a semiconductor integrated circuit device, said process comprising:
    forming a photoresist film on an etch target material,
    forming a first hole comprising patterning said photoresist film such that a surface of said etch target material is exposed,
    depositing an amorphous carbon film on said photoresist film and a side wall of said first hole to have a film thickness of said amorphous carbon film such that said first hole is not filled with said amorphous carbon film and a diameter of an upper portion of said first hole is less than a diameter of a lower portion of said first hole, and
    forming a second hole in said etch target material, said forming said second hole comprising using one of said amorphous carbon film and a combination of said amorphous carbon film and said photoresist film as a mask.

2. The process for producing a semiconductor integrated circuit device according to claim 1, wherein said depositing said amorphous carbon film comprises using a plasma chemical vapor deposition (CVD) method.

3. The process for producing a semiconductor integrated circuit device according to claim 1, further comprising:
    forming an antireflection film between said etch target material and said photoresist film,
    wherein said forming said first hole further comprises:
        forming a predetermined hole in said photoresist film; and
        removing the antireflection film exposed at a bottom portion of said predetermined hole after said forming said predetermined hole.

4. The process for producing a semiconductor integrated circuit device according to claim 1, wherein said depositing said amorphous carbon film comprises forming said amorphous carbon film by chemical vapor deposition (CVD), and wherein said CVD uses a raw material gas selected from a group consisting of acetylene, propene, butane, methane, ethane, propane, and butane in said forming said amorphous carbon film.

5. The process for producing a semiconductor integrated circuit device according to claim 1, wherein said film thickness of said amorphous carbon film is less than one-half of a diameter of said first hole.

6. The process for producing a semiconductor integrated circuit device according to claim 5, wherein said film thickness of said amorphous carbon film is greater than or equal to 1 nm.

7. The process for producing a semiconductor integrated circuit device according to claim 1, wherein said depositing said amorphous carbon film comprises depositing said amorphous carbon film on said exposed surface of said etch target material.

8. The process for producing a semiconductor integrated circuit device according to claim 1, wherein said amorphous carbon film consists essentially of amorphous carbon.

9. The process for producing a semiconductor integrated circuit device according to claim 1, wherein said depositing said amorphous carbon film comprises using one of sputtering and chemical vapor deposition (CVD).

10. A process for producing a semiconductor integrated circuit device, said process comprising:
    forming a photoresist film on an etch target material;
    forming a first hole having an aspect ratio of 1.8 or greater, said forming said first hole comprising patterning said photoresist film such that a surface of said etch target material is exposed;
    depositing an amorphous carbon film on said photoresist film and a side wall of said first hole to have a film thickness of said amorphous carbon film such that said first hole is not filled with said amorphous carbon film and a diameter of an upper portion of said first hole is less than a diameter of a lower portion of said first hole; and
    forming a second hole in said etch target material, said forming said second hole comprising using one of said amorphous carbon film and a combination of said amorphous carbon film and said photoresist film as a mask.

11. The process for producing a semiconductor integrated circuit device according claim 10, wherein said amorphous carbon film is not deposited on said exposed surface of said etch target material.

12. A process for producing a semiconductor integrated circuit device, said process comprising:
    forming a photoresist film on an insulating film formed on a substrate;
    forming a first hole comprising patterning said photoresist film such that a surface of said insulating film is exposed;
    depositing an amorphous carbon film on said photoresist film and a side wall of said first hole to have a film thickness of said amorphous carbon film such that said first hole is not filled with said amorphous carbon film and a diameter of an upper portion of said first hole is less than a diameter of a lower portion of said first hole; and
    forming a second hole in said insulating film, said forming said second hole comprising using one of said amorphous carbon film and a combination of said amorphous carbon film and said photoresist film as a mask.

13. The process for producing a semiconductor integrated circuit device according to claim 12, wherein said insulating film comprises one of a silicon dioxide film, a silicon nitride film, a silicon oxynitride film, a methylsiloxane insulating film, porous SiOC, and porous SiOCH.

14. The process for producing a semiconductor integrated circuit device according to claim 12, wherein said forming said second hole further comprises extending said second hole to said substrate such that said second hole does not include said substrate.

15. The process for producing a semiconductor integrated circuit device according to claim 12, wherein said depositing said amorphous carbon film is conducted when an RF power is in a range from 200 W to 800 W and said substrate has a temperature in a range from 80° C. to 100° C.

16. A process for producing a semiconductor integrated circuit device, said process comprising:
    forming a sacrificial hard mask layer on an insulating film formed on a substrate,
    forming a photoresist film on said sacrificial hard mask layer,
    forming a patterning hole comprising patterning said photoresist film such that a surface of said sacrificial hard mask layer is exposed on said insulating film,
    depositing an amorphous carbon film on said photoresist film and a side wall of said patterning hole to have a film thickness of said amorphous carbon film such that said patterning hole is not filled with said amorphous carbon film and a diameter of an upper portion of said patterning hole is less than a diameter of a lower portion of said patterning hole, forming a mask hole in said sacrificial hard mask layer, said forming said mask hole comprising using one of said amorphous carbon film and a combination of said amorphous carbon film and said photoresist film as a mask, forming an insulating hole in said insulating film through the mask hole, filling said insulating hole with a resist after said forming said insulating hole, and removing said sacrificial hard mask layer remaining on the insulating film after said filling said insulating hole.

17. The process for producing a semiconductor integrated circuit device according to claim 16, wherein said insulating film comprises a silicon dioxide film, and wherein said forming said sacrificial hard mask layer comprises forming a polysilicon film.

* * * * *